(12) United States Patent
Zhai

(10) Patent No.: US 12,033,982 B2
(45) Date of Patent: *Jul. 9, 2024

(54) FULLY INTERCONNECTED HETEROGENEOUS MULTI-LAYER RECONSTRUCTED SILICON DEVICE

(71) Applicant: Apple Inc., Cupertino, CA (US)

(72) Inventor: Jun Zhai, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/457,350

(22) Filed: Dec. 2, 2021

(65) Prior Publication Data
US 2022/0157782 A1    May 19, 2022

Related U.S. Application Data

(63) Continuation of application No. 16/869,468, filed on May 7, 2020, now Pat. No. 11,217,563.

(60) Provisional application No. 62/925,562, filed on Oct. 24, 2019.

(51) Int. Cl.
    *H01L 25/065*    (2023.01)
(52) U.S. Cl.
    CPC ...... *H01L 25/0657* (2013.01); *H01L 2224/05009* (2013.01); *H01L 2225/06513* (2013.01)
(58) Field of Classification Search
    CPC ....... H01L 25/0657; H01L 2225/06513; H01L 2224/05009; H10B 80/00
    See application file for complete search history.

(56) References Cited

U.S. PATENT DOCUMENTS

| 8,106,520 | B2 | 1/2012 | Keeth et al. |
| 8,330,489 | B2 | 12/2012 | Bartley et al. |
| 8,582,373 | B2 | 11/2013 | Hollis |
| 9,000,577 | B2 | 4/2015 | Droege et al. |
| 9,601,463 | B2 | 3/2017 | Yu et al. |
| 9,666,562 | B2 * | 5/2017 | Law .................... H01L 23/5384 |
| 9,712,168 | B1 * | 7/2017 | Samson .......... H03K 19/00369 |
| 11,217,563 | B2 * | 1/2022 | Zhai ....................... H01L 21/56 |
| 2009/0067851 | A1 | 3/2009 | Krishnamoorthy et al. |

(Continued)

FOREIGN PATENT DOCUMENTS

| CN | 110323143 A | 10/2019 |
| TW | 201814328 A | 11/2018 |

(Continued)

OTHER PUBLICATIONS

Podpod Arnita et al: "A Novel Fan-Out Concept for Ultra-High Chip-to-Chip Interconnect Density with 20-m Pitch", 2018 IEEE 68th Electronic Components and Technology Conference (ECTC), IEEE, May 29, 2018 (May 29, 2018), pp. 370-378.

(Continued)

*Primary Examiner* — Timor Karimy
(74) *Attorney, Agent, or Firm* — Aikin & Gallant, LLP

(57) ABSTRACT

Reconstructed 3DIC structures and methods of manufacture are described. In an embodiment, one or more dies in each package level of a 3DIC are both functional chips and/or stitching devices for two or more dies in an adjacent package level. Thus, each die can function as a communication bridge between two other dies/chiplets in addition to performing a separate chip core function.

19 Claims, 9 Drawing Sheets

(56) References Cited

U.S. PATENT DOCUMENTS

| | | | |
|---|---|---|---|
| 2009/0189275 A1* | 7/2009 | Ko ..................... | H01L 23/4334 |
| | | | 257/E23.024 |
| 2013/0320567 A1 | 12/2013 | Thacker et al. | |
| 2015/0113195 A1 | 4/2015 | Kim | |
| 2015/0375996 A1 | 12/2015 | Kuisma | |
| 2016/0071818 A1 | 3/2016 | Wang et al. | |
| 2017/0186730 A1 | 6/2017 | Shen et al. | |
| 2019/0304959 A1 | 10/2019 | Yu et al. | |
| 2019/0318993 A1 | 10/2019 | Mahajan et al. | |
| 2020/0105719 A1* | 4/2020 | Li .......................... | H01L 25/50 |
| 2020/0381398 A1* | 12/2020 | Lan ........................ | H01L 24/08 |

FOREIGN PATENT DOCUMENTS

| | | |
|---|---|---|
| TW | 201841328 A | 11/2018 |
| WO | 2019132966 A1 | 7/2019 |

OTHER PUBLICATIONS

PCT/US2020/056102, "Notification of Transmittal of the International Search Report and the Written Opinion of the International Searching Authority, or the Declarations", mailed Jan. 25, 2021, 14 pages.

\* cited by examiner

FULLY INTERCONNECTED HETEROGENEOUS MULTI-LAYER RECONSTRUCTED SILICON DEVICE

RELATED APPLICATIONS

This application is a continuation of co-pending U.S. patent application Ser. No. 16/869,468, filed May 7, 2020, which claims the benefit of priority of U.S. Provisional Patent Application Ser. No. 62/925,562 filed on Oct. 24, 2019, both of which are incorporated herein by reference.

BACKGROUND

Field

Embodiments described herein relate to integrated circuit (IC) manufacture, and the interconnection of multiple dies.

Background Information

A multi-chip module (MCM) is generally an electronic assembly in which multiple dies are integrated on a substrate. Various implementations of MCMs include 2D, 2.5D and 3D packaging. Generally, 2D packaging modules include multiple dies arranged side-by-side on a package substrate. In 2.5D packaging technologies multiple dies and bonded to an interposer with microbumps. The interposer in turn is then bonded to a package substrate. The interposer may include routing to interconnect the adjacent dies. Thus, the dies in 2.5D packaging can be directly connected to the interposer and are connected with each other through routing within the interposer. Generally, 3D packaging modules include multiple dies stacked vertically on top of each other. Thus, the dies in 3D packaging can be directly connected to each other, with the bottom die directly connected to a package substrate. The top die in a 3D package can be connected to the package substrate using a variety of configurations, including wire bonds, and through-silicon vias (TSVs) though the bottom die.

A subset of 3D packaging technology includes 3D stacked integrated circuits, or 3DIC, which refers to stacking of IC chips using through silicon vias (TSVs). Traditional stacking approaches for 3DIC include die-to-die stacking, die-to-wafer stacking followed by singulation, and wafer-to-wafer stacking followed by singulation. In each case, conventional 3DIC packaging approaches assume the bottom die is a super-set footprint for the final 3DIC package.

SUMMARY

Reconstructed 3DIC structures and methods of manufacture are described. In an embodiment, a reconstructed 3DIC includes a first package level including a first plurality of dies and a second package level including a second plurality of dies bonded to the first package level. A communication path exists that travels up and down between the first package level and the second package level, where a first group of one or more dies in the first plurality of dies function as both functional dies and stitching devices for two or more of the second plurality of dies, and a second group of one or more dies in the second plurality of dies function as both functional dies and stitching devices for two or more of the first plurality of dies.

In an embodiment, a method of fabricating a reconstructed 3DIC includes bonding a second plurality of dies onto a first reconstructed wafer including a first plurality of dies embedded in a first gap fill material. Bonding of the second plurality of dies to the first reconstructed wafer can utilize hybrid bonding in an embodiment. For example, bonding may be wafer-on-wafer in which the second plurality of dies is in a second reconstructed wafer, or chip-on-wafer where the second plurality of dies are discrete, and a second gap fill material is subsequently applied around the second plurality of dies after hybrid bonding.

DETAILED DESCRIPTION

Figure 1A:
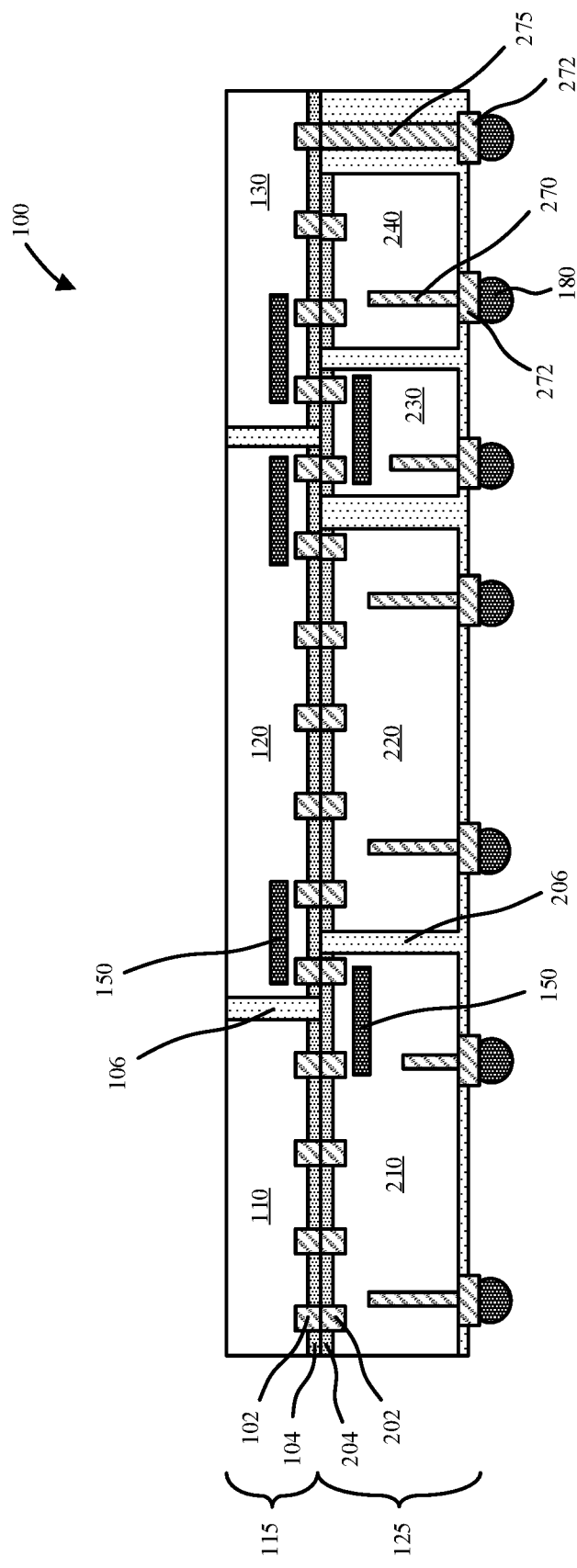
FIG. 1A is a cross-sectional side view illustration of a reconstructed 3DIC structure with hybrid bonding in accordance with an embodiment.

Embodiments describe 3DIC structures in which the dies in each package level are both functional chips and/or stitching devices for two or more dies in an adjacent package level. Thus, each die can function as a communication bridge between two other dies/chiplets in addition to performing a separate chip core function. Exemplary chip core functions include computing (e.g. central processing unit, general processing unit), memory (static random-access memory (SRAM), dynamic random-access memory (DRAM), magnetoresistive random-access memory (MRAM), etc.), analog/mixed signal (input/output (I/O), power amplifier (PA), radio frequency (RF), physical layer (PHY), etc.). In this manner, the dies can form a full 3DIC interconnect fabric among all the dies on all package levels. Passive silicon interposer stitching dies can also be included within the die interconnect fabric.

In one aspect, it has been observed that with conventional 3DIC packaging approaches the bottom die is a super-set footprint for the final 3DIC package. Furthermore, known bottom die stitching techniques can be limited to passive silicon interposers, or upper metal layers in the active dies with coarse interconnect density, and low yields. Furthermore, such die stitching techniques may still require 2× reticle size. Conversely, the bottom die size is not a limitation to the final footprint with the 3DIC packaging solutions in accordance with embodiments. The 3DIC structures in accordance with embodiments may be fabricated using a reconstructed wafer approach using heterogeneous active dies, where all dies are known good dies, and a communication path (i.e. communication bridge path) can exist between any give pair of terminals. Thus, the communication bridges can be incorporated into the silicon within each and all (active) dies, where each die can be bonded to a pair of dies in an opposing package level to provide the communication path (or die stitching) between the two dies. Furthermore, the die sizes can be reduced. In accordance with many embodiments, the dies may be chiplets, where functionality can be reduced be as minimalist as desired, such as to IP banks, while still including communication bridges.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between" and "on" as used herein may refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

Figure 1B:
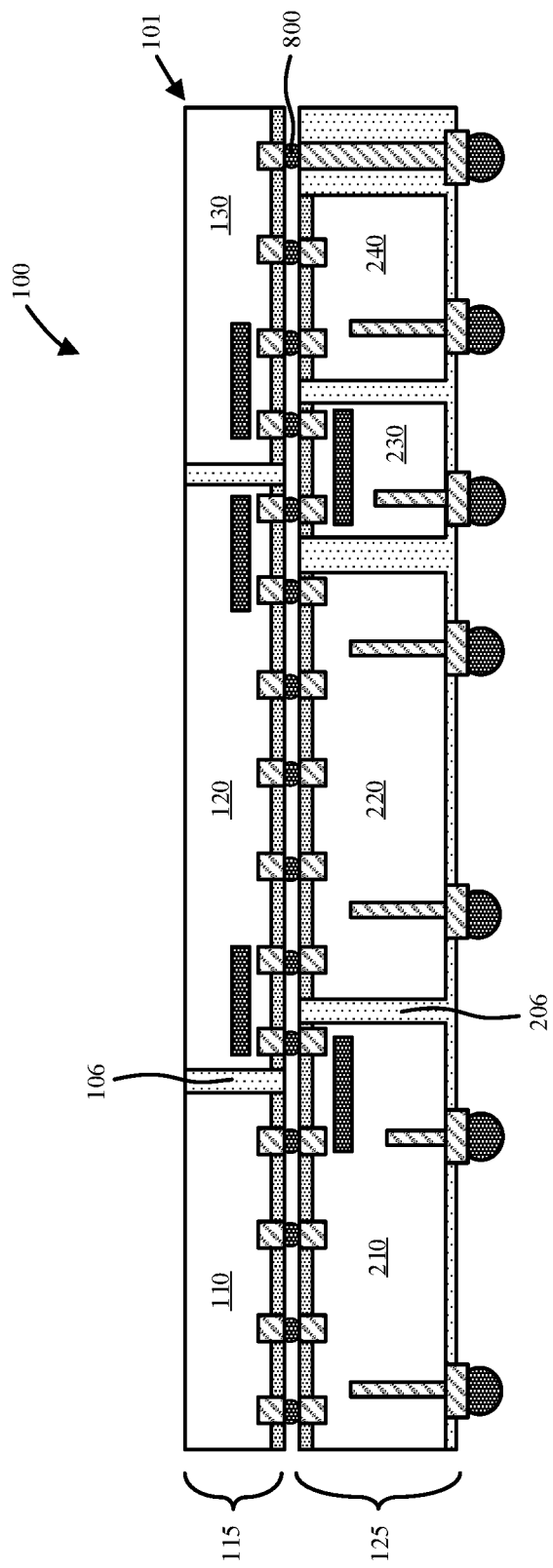
FIGS. 1B-1C are cross-sectional side view illustrations of reconstructed 3DIC structures with microbumps in accordance with an embodiment.
Figure 1C:
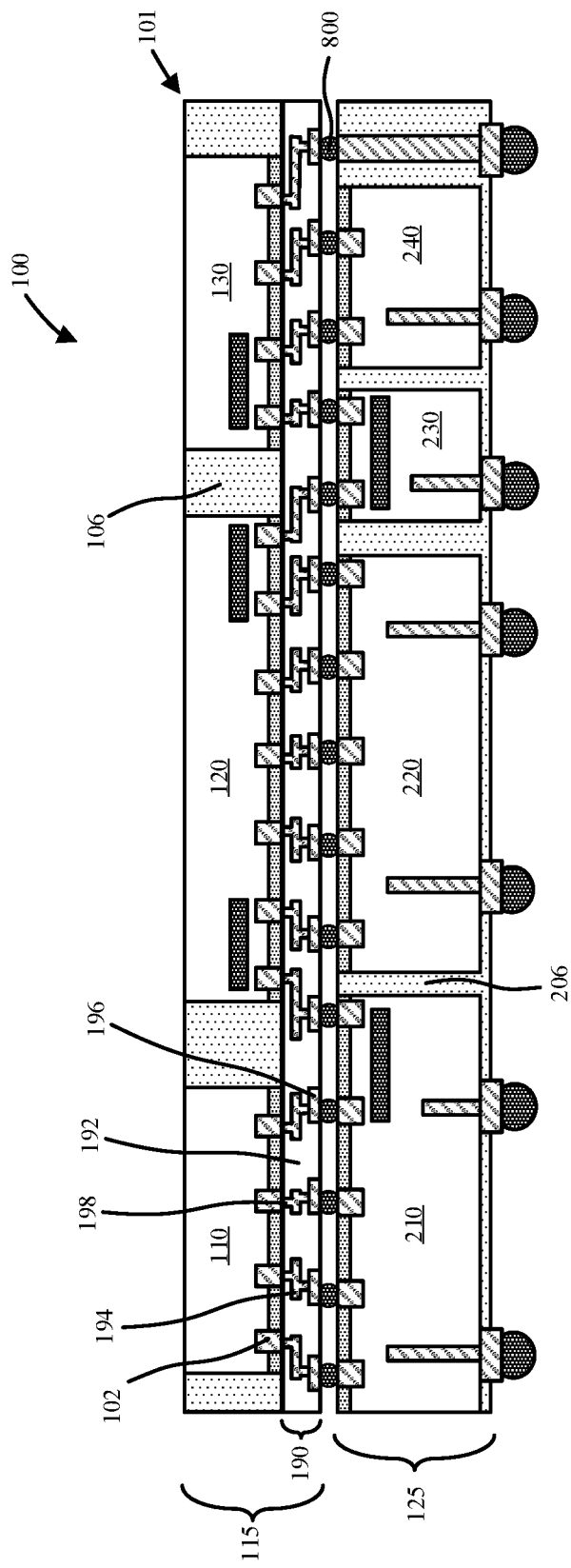

FIG. 1A is a cross-sectional side view illustration of a reconstructed 3DIC structure 100 with hybrid bonding in accordance with an embodiment. FIG. 1B is a cross-sectional side view illustration of a reconstructed 3DIC structure 100 with microbumps 800 in accordance with an embodiment. FIG. 1C is a cross-sectional side view illustration of a reconstructed 3DIC structure 100 including a redistribution layer (RDL) 190 and microbumps 800 in accordance with an embodiment. In the following description, it is to be appreciated that both hybrid bonding and microbumps may be utilized to form the reconstructed 3DIC structures described herein. Microbumps 800 may utilize more conventional assembly techniques, while hybrid bonding with metal-metal and oxide-oxide bonding can achieve a high connection density, and lower latency, for higher end applications, as well as smaller z-height. Furthermore, an RDL 190 may be included to relax pad pitch between the package levels.

As shown, the reconstructed 3DIC structures 100 can include a first upper package level 115 and a second lower package level 125. Only two package levels are illustrated in FIGS. 1A-1C, though embodiments may be extended to additional package levels. As shown, the upper package level can include a plurality of dies 110, 120, 130 (or chiplets). All, or only a group of the plurality of dies 110, 120, 130 may include a communication bridge routing 150, which is used to connect at least two chips from an adjacent package level. Communication bridge routing 150 may include one or more active devices such as, but not limited to, a repeater, a flop, a buffer, and a transistor.

As shown in FIG. 1A, each of the dies 110, 120, 130 have an active side face down that includes a plurality of contact pads 102 and a dielectric (oxide) layer 104. In an embodiment, the plurality of dies 110, 120, 130 in the first package level 115 are embedded in a gap fill material 106. For example, this may be an oxide used for hybrid bonding, though other materials may be used, such as silicon.

The second package level 125 may be similar to the first package level 115, including a plurality of dies 210, 230, 240. Optionally an interposer chiplet 220 can be included in either package level 115, 125. It is to be appreciated that while three dies are illustrated in the first and second package levels that this is for illustrational purposes only, and any number of dies can be included.

Similar to the first package level dies 110, 120, 130, the second package level dies 210, 230, 240, and passive interposer chiplet 220 may include active side face up (toward the first package level 115) that includes a plurality of contact pads 202 and a dielectric (oxide) layer 204. All, or only a group of the plurality of dies 210, 230, 240 may include a communication bridge routing 150, which is used to connect at least two chips from an adjacent package level. In an embodiment, the plurality of dies 210, 230, 240 in the second package level 125 are embedded in a gap fill material 206. For example, this may be an oxide used for hybrid bonding, though other materials may be used, such as silicon. Furthermore, some or all of the dies 210, 230, 240, and passive interposer chiplet 220, in the second package level may have one or more through silicon vias (TSVs) 270 that extend to the downward facing back sides. For example, the TSVs 270 can be coupled to back side landing pads 272. Solder bumps 180 may optionally be placed on the back side landing pads 272 in an embodiment where the second package level 125 is the lower-most package level used for mounting onto a package substrate. The TSVs 270 may provide electrical connections between the package substrate and the second package level 125. In an embodiment, one or more through oxide vias (TOVs) 275 are formed through the gap fill material 206 to the first package level 115. In alternative embodiments in which the gap fill material 206 is not an oxide material, the TOVs 275 may optionally be replaced with a through mold via, or alternative interconnect.

In an exemplary application, the first and second package level die sets can include multiple chiplets for computing (e.g. central processing unit, general processing unit), memory (SRAM, DRAM, MRA, etc.), analog/mixed signal (I/O, PA, RF, PHY, etc.). In this manner, the dies can form a full 3DIC interconnect fabric among all the dies on all package levels. Passive silicon interposer stitching dies can also be included within the die interconnect fabric.

In the particular embodiment illustrated in FIG. 1B, the top dies 210, 230, 240 (and optionally one or more passive interposer chiplets 220) can be bonded to the first package level 115 with a plurality of microbumps 800. The first package level dies 110, 120, 130 can be individually bonded using a chip-on-wafer bonding technique followed by formation of the gap fill material 206, or the second package level 125 can be bonded to the first package level 115 using a wafer-on-wafer bonding technique. As shown in FIG. 1C an RDL 190 may optionally be formed as part of the first package level 115 in accordance with embodiments. The RDL 190 may span across the first package level dies 110, 120, 150 and gap fill material 106. The RDL 190 may fan out routing from contact pads 102 of the first package level 115 to contact pads 202 of the second package level 125. RDL may include one or more redistribution lines 194 (e.g. copper), dielectric layers 192 (e.g. oxide, polymer, or other dielectric material), and landing pads 196, for example to receive the microbumps 800. RDL 190 may optionally contact the contact pads 102 using microvias 198 formed (e.g. drilled) in a dielectric layer 192.

Figure 2:
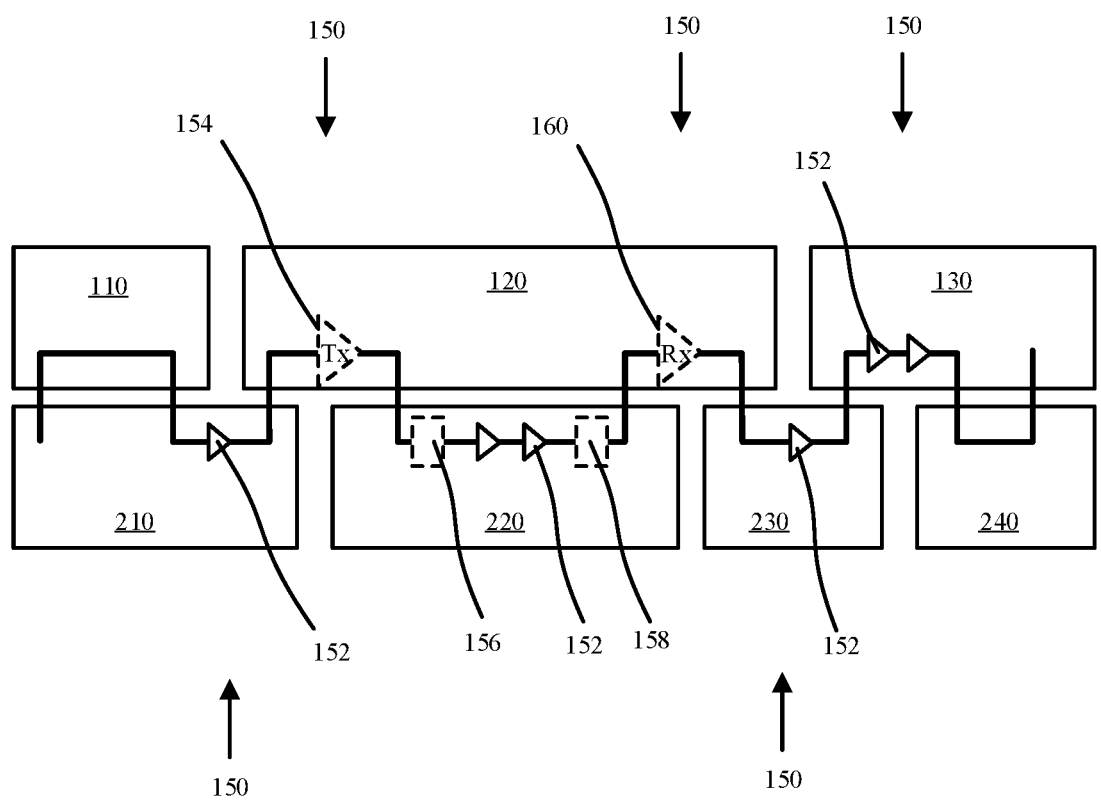
FIG. 2 is a schematic illustration of a communication path flowing through the multiple package levels of a reconstructed 3DIC structure in accordance with an embodiment.

FIG. 2 is a schematic illustration of a communication path flowing through the multiple package levels of a reconstructed 3DIC structure 100 in accordance with an embodiment. It is to be appreciated that this illustration is exemplary and intended to illustrate the interconnect fabric between the dies in adjacent package levels. As shown, some or all of the dies can include a communication bridge routing 150 to connect at least two dies from an adjacent package level. Thus, the communication bridge routing 150 in effect can stitch adjacent dies together. These interconnected communication bridge routings 150 form the interconnect fabric from die-to-die and between the dies in adjacent package levels.

As shown in FIG. 2, any of the communication bridge routings 150 can include includes one or more active devices 152 such as a repeater, a flop, a buffer, and/or a transistor. As shown, a passive interposer chiplet 220 can also be included in either package level, and the communication path can travel through the passive interposer chiplet 220. In an embodiment, the communication path can optionally include one or more transceivers 154 and receivers 160, as well as serializers 156 and deserializers 158. It is to be appreciated that while the components are illustrated as being within specific dies, that the components may be distributed in any die/chiplet as desired. In the embodiment illustrated, the terminal dies in the communication path do not include a communication bridge routing 150. This may be due to the edge location where only a single die-to-die interconnect is practical. In an embodiment, die 110 corresponds to an I/O die. In an embodiment, die 240 corresponds to a CPU die.

In an embodiment, a reconstructed 3DIC 100 includes first package level 115 including a first plurality of dies 110, 120, 130 and a second package level 125 including a second plurality of dies 210, 230, 240 (and optional interposer chiplet 220) bonded to the first package level 115. A communication path exists that travels up and down between the first package level 115 and the second package level 125, where a first group of one or more dies 120, 130 in the first plurality of dies function as both functional dies and stitching devices for two or more of the second plurality of dies, and a second group of one or more dies 210, 230 in the second plurality of dies function as both functional dies and stitching devices for two or more of the first plurality of dies. This may be inclusive of die stitching to a passive interposer chiplet 220.

Each die in the first group of dies and the second group of dies may include a corresponding communication bridge routing 150 through which the communication path extends. For example, each corresponding communication bridge routing 150 can be different, and may include one or more active devices 152 such as a repeater, a flop, a buffer, and a transistor, and combinations thereof. One or more passive interposer chiplets 220 can be located in either or both the first package level 115 and the second package level 125, where the communication path travels through the passive interposer chiplet(s) 220. In an embodiment, the communication path can further include a transceiver 154 and receiver 160.

In various embodiments, the second plurality of dies 210, 230, 240 can be bonded to the first package level 115 using a plurality of microbumps 800 (as shown in FIGS. 1B-1C) or hybrid bonding (as shown in FIG. 1A). Oxide (e.g. silicon oxide) gap fill materials may further facilitate hybrid bonding. In an embodiment, the first plurality of dies is embedded in an oxide gap fill material 106. Likewise, the second plurality of dies can be embedded in a second oxide gap fill material (e.g. silicon oxide) 206, particularly when used for hybrid bonding. Both the first and second oxide gap fill materials may be the same material and may be directly bonded to a die in an opposing package level.

In an embodiment, a plurality of TSVs 270 extend through at least a portion, or all, of the second plurality of dies 210, 230, 240, and optionally the passive interposer chiplet 220. A corresponding plurality of landing pads 272 can be coupled with the plurality of TSVs 270, and a plurality of solder bumps 180 may optionally be attached to the plurality of landing pads 272. Additional TSVs and landing pads may be provided in additional package levels as necessary for vertical routing.

Figure 3:
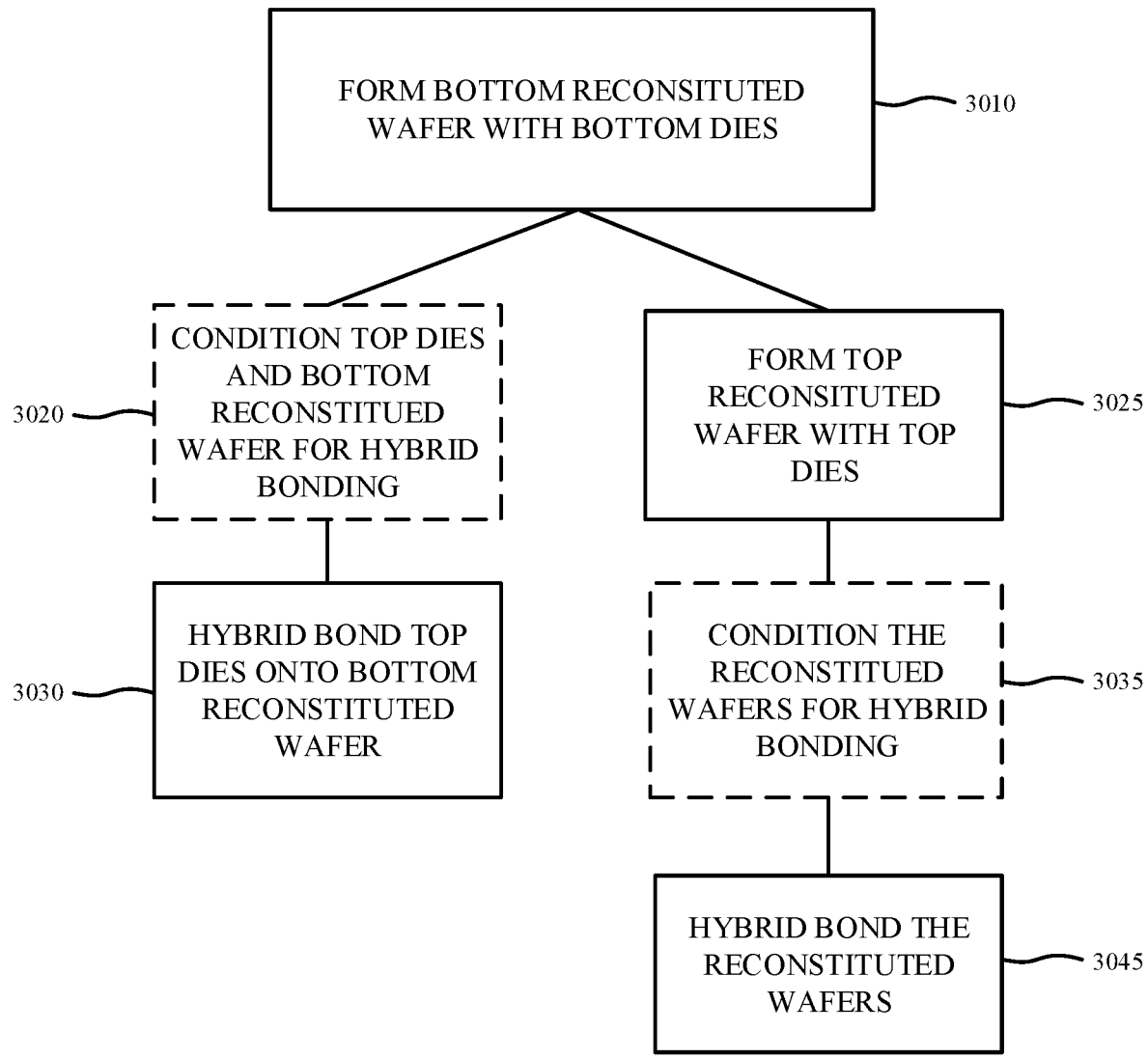
FIG. 3 is a process flow for methods of fabricating a reconstructed 3DIC structure in accordance with embodiments.
Figure 4A:
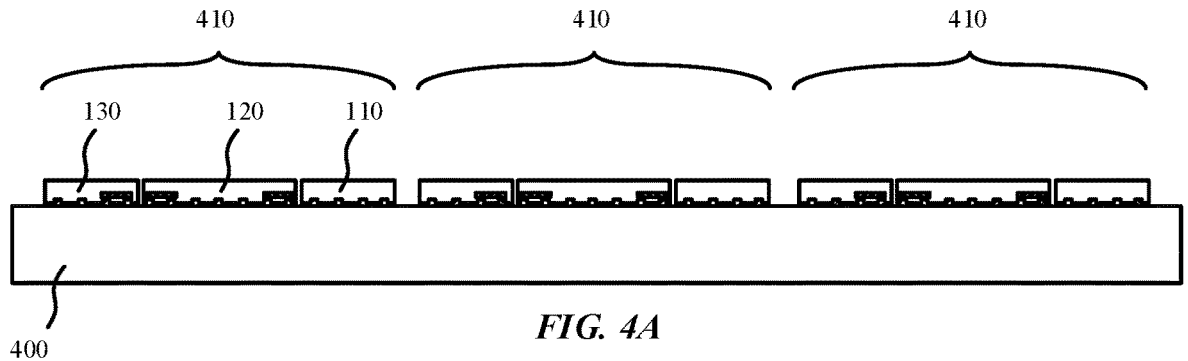
FIGS. 4A-4D are schematic cross-sectional side view illustrations of a process flow for forming a reconstructed wafer in accordance with an embodiment.
Figure 4B:
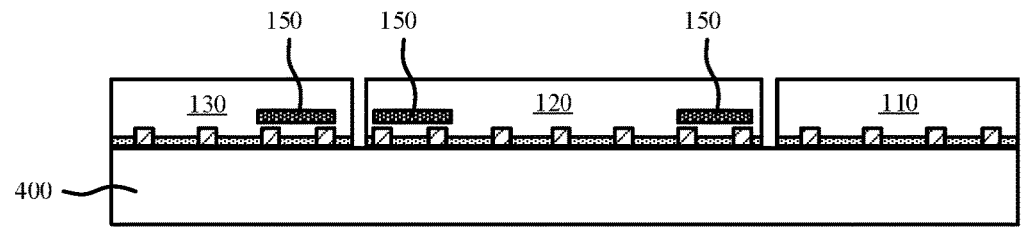
Figure 4C:
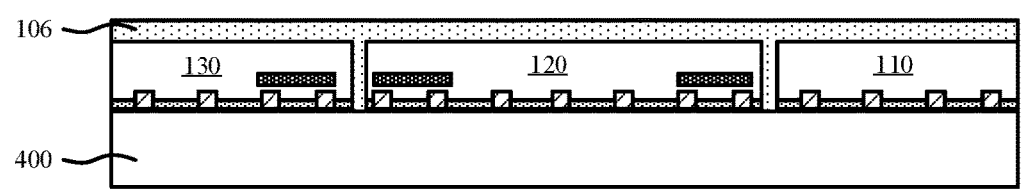
Figure 5A:
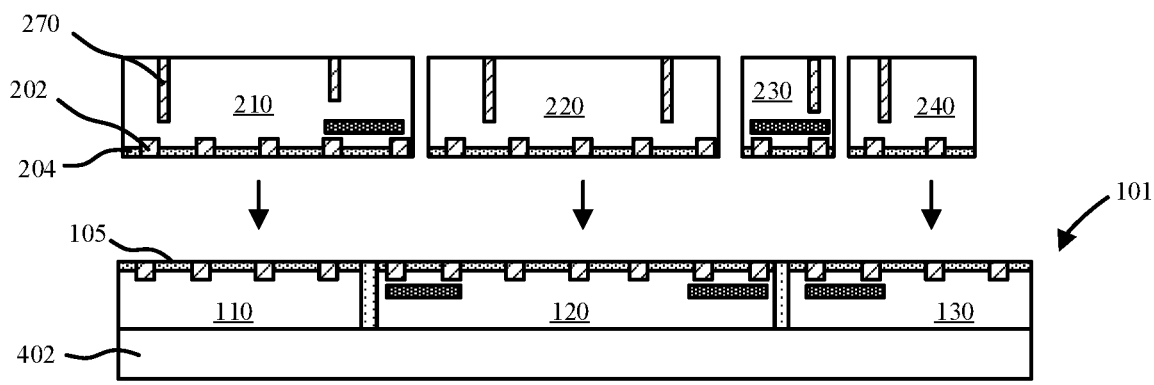
FIGS. 5A-5C are schematic cross-sectional side view illustrations for a chip-on-wafer process flow for forming a reconstructed 3DIC structure in accordance with an embodiment.
Figure 5B:
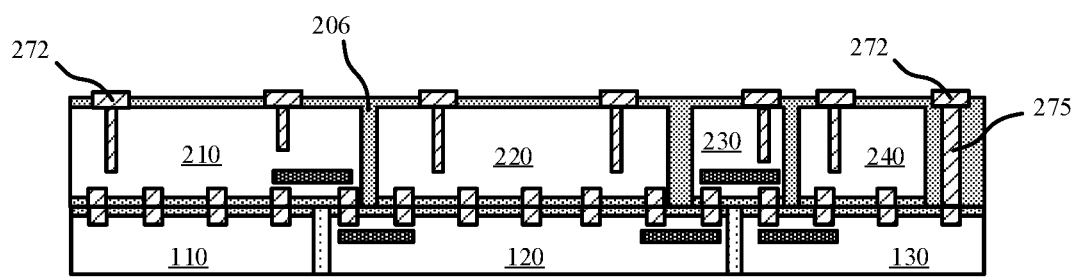
Figure 5C:
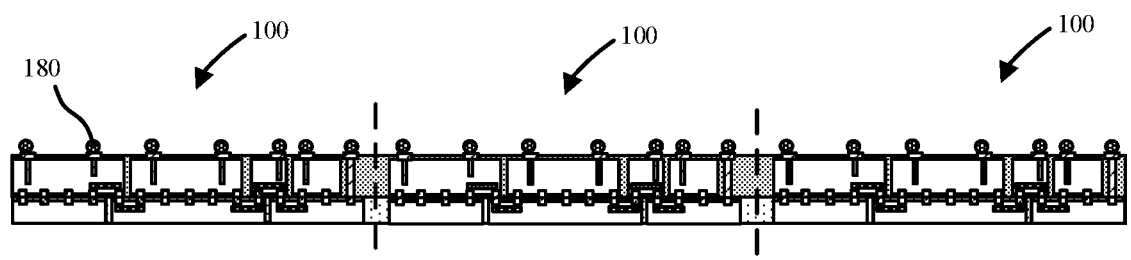
Figure 6A:
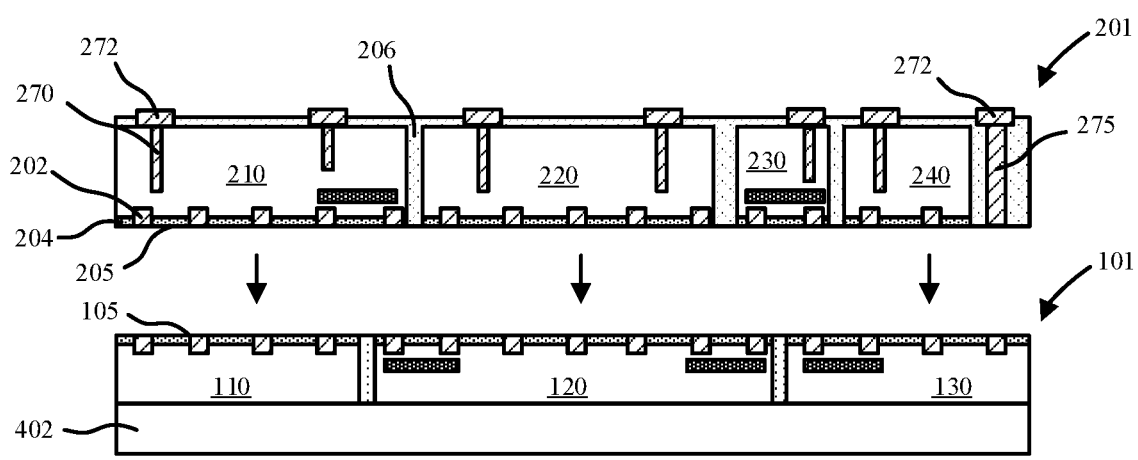
FIGS. 6A-6B are schematic cross-sectional side view illustrations for a wafer-on-wafer process flow for forming a reconstructed 3DIC structure in accordance with an embodiment.
Figure 6B:
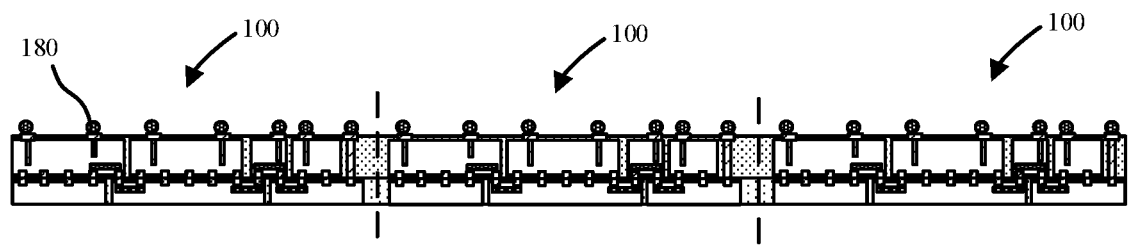

FIG. 3 is a process flow for methods of fabricating a reconstructed 3DIC structure in accordance with embodiments. FIGS. 4A-4D are schematic cross-sectional side view illustrations of a process flow for forming a reconstructed wafer in accordance with an embodiment. FIGS. 5A-5C are schematic cross-sectional side view illustrations for a chip-on-wafer process flow for forming a reconstructed 3DIC structure in accordance with an embodiment. FIGS. 6A-6B are schematic cross-sectional side view illustrations for a wafer-on-wafer process flow for forming a reconstructed 3DIC structure in accordance with an embodiment. In interest of clarity and conciseness, the process flow of FIG. 3 is discussed concurrently with the process flows illustrated in FIGS. 4A-4D, FIGS. 5A-5C, and FIG. 6A-6B.

At operation 3010 a bottom reconstructed wafer is formed with bottom dies. For example, such a bottom reconstructed wafer may be fabricated using the process sequence illustrated in FIGS. 4A-4D. As shown, a plurality of die sets 410 can be placed onto a carrier substrate 400, such as a silicon wafer or rigid glass substrate using a pick and place apparatus. FIG. 4B is a close-up view of a single die set 410 mounted on the carrier substrate, with each die 110, 120, 130 mounted face down. A gap fill material 106 may then be deposited over the plurality of dies 110, 120, 130 as shown in FIG. 4C. For example, gap fill material 106 may be an oxide material (e.g. silicon oxide). Exemplary methods of forming an oxide gap fill include chemical vapor deposition (CVD), plasma enhanced CVD (PECVD), sub-atmospheric CVD (SA-CVD) and selective oxide deposition (SELOX).

In an alternative configuration, the gap fill material 106 may be formed of another material such as silicon. Silicon may be a suitable material for thermal expansion matching to the dies. Exemplary methods for forming a silicon gap fill include epitaxial techniques such as CVD, PECVD, low pressure CVD (LPCVD), and hot wire CVD, as well as sputtering, silicon ink, silicon paste, and electro-deposition.

Figure 4D:
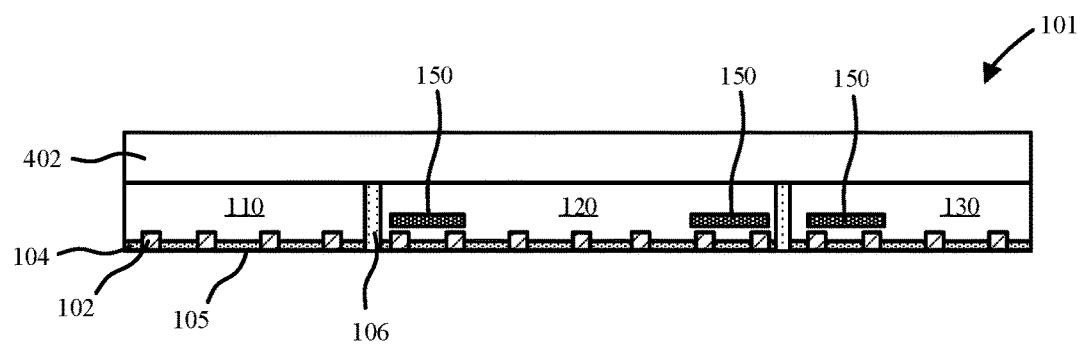

The gap fill material 106 may optionally be thinned to expose the dies, followed by attaching a mechanical support substrate 402 on top of the dies as shown in FIG. 4D. For example, this may be a simple fusion wafer to wafer bond.

The carrier substrate 400 may then be removed as shown in FIG. 4D to expose the plurality of contact pads 102 and dielectric (oxide) layer 104. At this point the bottom reconstructed wafer 101 may include a hybrid bonding surface 105 including the exposed contact pads 102, dielectric (oxide) layer 104, and gap fill material 106. Where the gap fill material 106 is formed of an oxide, the gap fill material 106 may contributed to oxide-oxide bonds during hybrid bonding. An RDL 190 may also be formed at this stage. In such an embodiment, gap fill material 106 need not be used for hybrid bonding, and may be formed of a variety of materials, including polymer.

Referring again to FIG. 3, at operation 3020 top dies and the bottom reconstituted wafer are optionally conditioned for hybrid bonding. For example, this may include oxidation (e.g. of exposed silicon), deposition of an oxide layer, cleaning of exposed metal layers to remove oxide, etc. A variety of surface treatments, or thin film deposition can be used to condition the various components for hybrid bonding. At operation 3030, the bottom reconstructed wafer 101 of FIG. 4D is flipped over and top dies 210, 230, 240 (and optionally one or more passive interposer chiplets 220) are hybrid bonded to the bottom reconstructed wafer 101 as shown in FIG. 5A. In particular, such a processing step may be a chip-on-wafer bonding technique in which individual components (dies, chiplets) are bonded to the bottom reconstructed wafer 101. This can be followed by deposition of a second gap fill material 206 around, between, and optionally over the second plurality of dies. Second gap fill material 206 may be formed of a variety of materials including oxide, silicon, and even molding compound. In an embodiment, one or more through oxide vias (TOVs) 275 are formed through the gap fill material 206 to the bottom reconstructed wafer 101. In alternative embodiments in which the gap fill material 206 is not an oxide material, the TOVs 275 may optionally be replaced with a through mold via, or alternative interconnect. A plurality of back side landing pads 272 may then be formed on the TSVs 270 and TOVs 275.

Referring to FIG. 5C, a plurality of solder bumps 180 can optionally be placed on the back side landing pads 272, followed by dicing of individual 3DIC structures 100.

Referring now to FIG. 6A, in a wafer-on-wafer process flow a top reconstructed wafer 201 can be formed with top dies 210, 230, 240 and optionally one or more passive interposer chiplets 220 at operation 3025. The top reconstructed wafer 201 may optionally include a pre-formed TOV 275 (or equivalent), as well as optional landing pads 272. Similar to operation 3030, at operation 3035 the top and bottom reconstructed wafers 201, 101 can optionally be conditioned for hybrid bonding of hybrid bonding surfaces 205, 105. This is followed by hybrid bonding of the top and bottom reconstructed wafers 201, 101 at operation 3045. In an alternative arrangement TOV(s) 275 and landing pads 272 can be formed after hybrid bonding. Alternatively, the top and bottom reconstructed wafers 201, 101 can be bonded with microbumps 800 as shown in FIGS. 1B-1C. Referring to FIG. 6B, a plurality of solder bumps 180 can optionally be placed on the back side landing pads 172, followed by dicing of individual 3DIC structures 100.

In an embodiment, a method of fabricating a reconstructed 3DIC includes bonding a second plurality of dies 210, 230, 240 on a first reconstructed wafer 101 including a first plurality of dies 110, 120, 130 embedded in a first gap fill material. The dies are arranged such that a communication path travels up and down between the first plurality of dies 110, 120, 130 and the second plurality of dies 210, 230, 240. A first group of one or more dies 120, 130 in the first plurality of dies function as both functional dies and as stitching devices for two or more of the second plurality of dies 210, 230, 240. Likewise, a second group of one or more dies 210, 230 in the second plurality of dies function as both functional dies and stitching dies for two or more of the first plurality of dies 110, 120, 130. This is also inclusive of die stitching of a die to the passive interposer chiplet 220. As described, bonding of the second plurality of dies to the first reconstructed wafer 101 can utilize hybrid bonding in an embodiment. For example, bonding may be wafer-on-wafer in which the second plurality of dies is in a second reconstructed wafer, or chip-on-wafer where the second plurality of dies are discrete, and a second gap fill material is subsequently applied around the second plurality of dies after hybrid bonding.

It is to be appreciated that while the processing sequences of FIG. 3, FIGS. 4A-4D, FIGS. 5A-5C, and FIGS. 6A-6B have been described with regard to hybrid bonding, it is foreseeable that other bonding techniques may be utilized, such as microbumps 800 as shown in FIGS. 1B-1C. Furthermore, while the specific processing sequences terminated with two package levels, the processing sequences may be continued to add additional package levels.

Figure 7:
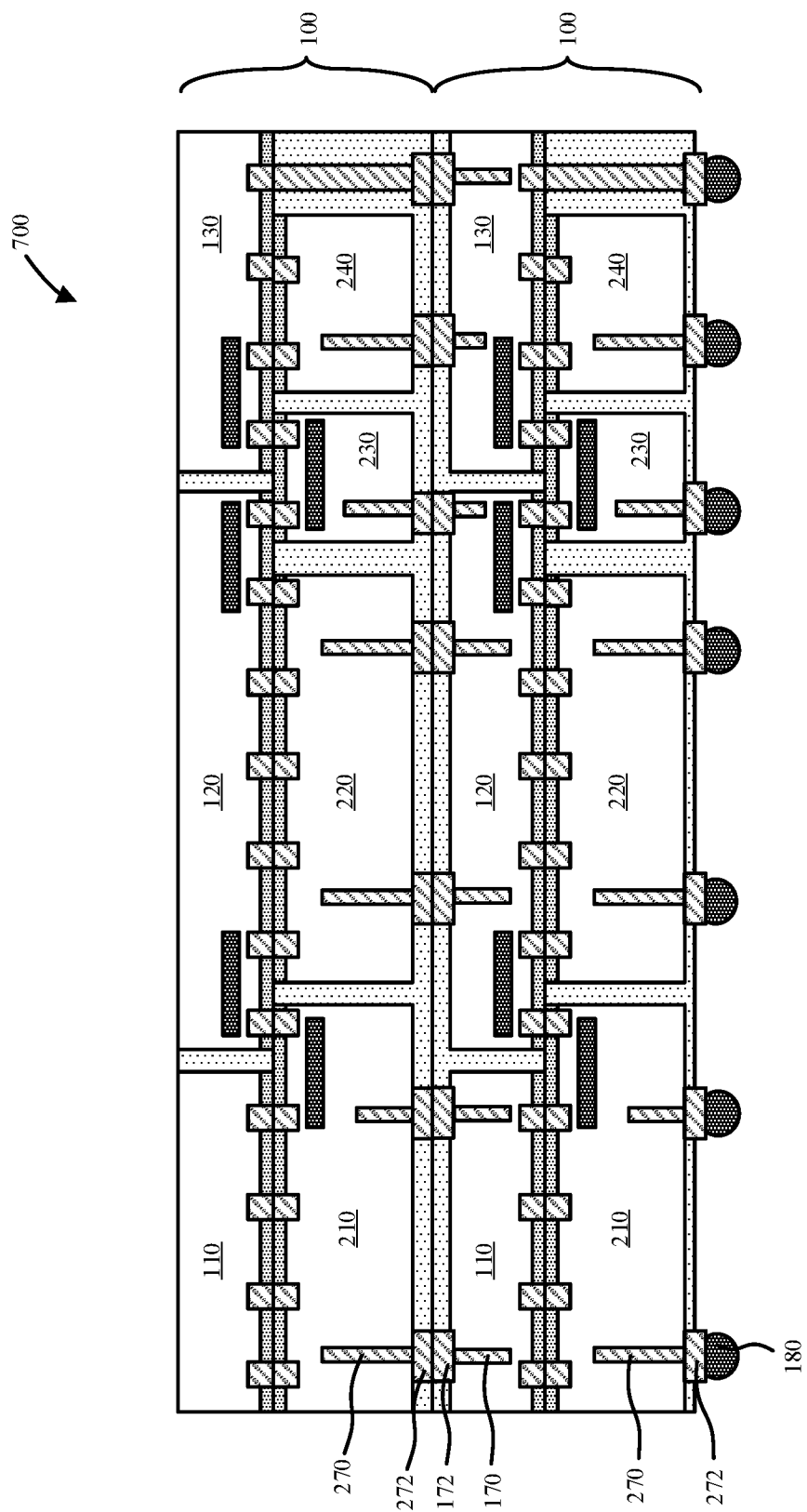
FIG. 7 is a cross-sectional side view illustration of a multi-layered reconstructed 3DIC structure in accordance with an embodiment.

FIG. 7 is a cross-sectional side view illustration of a multi-layered reconstructed 3DIC structure 700 in accordance with an embodiment. In accordance with embodiments, rather than dicing at FIGS. 5C and 6B, the processing sequences can be continued to add additional package levels. In the particular embodiment illustrated in FIG. 7, the reconstructed wafers of FIG. 5C or 6B can be stacked on top of one another and bonded using techniques such as hybrid bonding or micro bumps. In the embodiment illustrated, the back side TSV landing pads 172, 272 and gap fill materials 106, 206 can be hybrid bonded. In the particular embodiment illustrated, the reconstructed 3DIC structure includes a first plurality of TSVs 170 extending through the first plurality of dies 110, 120, 130. A third plurality of dies 210, 230, 240 (and optionally the passive interposer chiplet 220) are hybrid bonded to the first plurality of dies 110, 120, 130, for example, with the back side TSV landing pads 172, 272 and gap fill materials 106, 206. Alternatively, the 3DIC structures 100 can be bonded with microbumps. Likewise, the package levels within the individual 3DIC structures 100 can be bonded with microbumps, and may optionally include one or more RDLs.

In utilizing the various aspects of the embodiments, it would become apparent to one skilled in the art that combinations or variations of the above embodiments are possible for forming a reconstructed 3D structure. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A reconstructed three dimensional integrated circuit (3DIC) structure comprising:
   a first package level including a first plurality of dies;
   a second package level including a second plurality of dies bonded to the first package level with a plurality of microbumps; and
   a communication path that travels up and down between the first package level and the second package level, wherein a first group of one or more dies in the first plurality of dies function as both functional dies and stitching devices for two or more of the second plurality of dies; and a second group of one or more dies in the second plurality of dies function as both functional dies and stitching devices for two or more of the first plurality of dies, wherein each of the one or more dies of the first group of one or more dies and each of the one or more dies of the second group of one or more dies includes a corresponding chip core function selected from the group consisting of computing, memory, analog/mixed signal I/O, a power amplifier (PA), radio frequency (RF), and physical layer (PHY).

2. The reconstructed 3DIC structure of claim 1, wherein each die in the first group of dies and the second group of dies includes a corresponding communication bridge routing through which the communication path extends.

3. The reconstructed 3DIC structure of claim 2, wherein a communication bridge routing includes one or more active devices selected from the group consisting of a repeater, a flop, a buffer, and a transistor.

4. The reconstructed 3DIC structure of claim 3, further comprising a passive interposer chiplet in the first package level or the second package level, wherein the communication path travels through the passive interposer chiplet.

5. The reconstructed 3DIC structure of claim 3, wherein the communication path further comprises a transceiver and a receiver.

6. The reconstructed 3DIC structure of claim 1, wherein the second plurality of dies are bonded to a redistribution layer of the first package level with the plurality of microbumps.

7. The reconstructed 3DIC structure of claim 1, wherein the first plurality of dies is embedded in a first polymer gap fill material.

8. The reconstructed 3DIC structure of claim 7, wherein the second plurality of dies is embedded in a second polymer gap fill material.

9. The reconstructed 3DIC structure of claim 1, wherein the first plurality of dies is embedded in a first silicon gap fill material.

10. The reconstructed 3DIC structure of claim 9, wherein the second plurality of dies is embedded in a second silicon gap fill material.

11. The reconstructed 3DIC structure of claim 1, further comprising a plurality of through silicon vias (TSVs) extending through the second plurality of dies.

12. The reconstructed 3DIC structure of claim 11, further comprising:
a plurality of landing pads coupled with the plurality of TSVs; and
a plurality of solder bumps attached to the plurality of landing pads.

13. The reconstructed 3DIC structure of claim 11, further comprising a first plurality of TSVs extending through the first plurality of dies.

14. The reconstructed 3DIC structure of claim 13, further comprising a third plurality of dies bonded to the first plurality of dies.

15. The reconstructed 3DIC structure of claim 1, wherein one of the first plurality of dies includes the RF chip core function.

16. The reconstructed 3DIC structure of claim 1, wherein each of the one or more dies of the first group of one or more dies and each of the one or more dies of the second group of one or more dies includes different chip core functions.

17. The reconstructed 3DIC structure of claim 1, wherein each of the one or more dies of the first group of one or more dies and each of the one or more dies of the second group of one or more dies includes same chip core functions.

18. The reconstructed 3DIC structure of claim 1, wherein the first group of one or more dies in the first plurality of dies and the second group of one or more dies in the second plurality of dies each include one or more chiplets.

19. The reconstructed 3DIC structure of claim 1, wherein the first group of one or more dies in the first plurality of dies functions as a communication bridge between two chiplets in the second group of one or more dies in the second plurality of dies.

* * * * *